United States Patent

Nakazato

[11] Patent Number: 5,758,409
[45] Date of Patent: Jun. 2, 1998

[54] CONDUCTIVE BALL-PLACING APPARATUS

[75] Inventor: Sinichi Nakazato, Fukuoka, Japan

[73] Assignee: Matsushita Electric Industrial Co., Ltd., Osaka, Japan

[21] Appl. No.: 736,766

[22] Filed: Oct. 25, 1996

[30] Foreign Application Priority Data

Oct. 31, 1995 [JP] Japan .................... 7-282765

[51] Int. Cl.⁶ .......................... H01L 21/60; H05K 13/00; B23K 3/06
[52] U.S. Cl. .................. 29/739; 29/743; 29/DIG. 44; 228/41; 228/246; 279/3; 294/64.1
[58] Field of Search .................. 29/739, 743, DIG. 44; 228/41, 56.3, 103, 105, 245, 246, 180.22; 279/3; 414/737, 752; 294/2, 64.1

[56] References Cited

U.S. PATENT DOCUMENTS

| | | | |
|---|---|---|---|
| 4,462,534 | 7/1984 | Bitaillou et al. | 228/246 X |
| 5,205,896 | 4/1993 | Broun et al. | 228/246 X |
| 5,467,913 | 11/1995 | Nanekawa et al. | 228/41 |
| 5,601,229 | 2/1997 | Nakazato et al. | 228/246 |
| 5,615,823 | 4/1997 | Noda et al. | 228/246 X |
| 5,626,277 | 5/1997 | Kawada | 228/41 |

FOREIGN PATENT DOCUMENTS 307591  3/1989  European Pat. Off. ............ 228/246

*Primary Examiner*—Peter Vo
*Attorney, Agent, or Firm*—Watson Cole Stevens Davis, P.L.L.C.

[57] ABSTRACT

An apparatus for placing electrically-conductive balls on electrodes of workpieces so as to form projected electrodes includes a ball-placing head which picks up the conductive balls from a reservoir. Suction holes for respectively suction-holding the conductive balls are formed in a lower surface of a box member of the ball-placing head. Recesses are formed respectively in portions of this lower surface where the suction holes are not formed. The box member of the ball-placing head is caused to rest on an upper surface of layers of conductive balls stored in a container of the reservoir. In this condition gas is blown or injected into the container so as to fluidize the conductive balls. At this time the gas flows upward into the recesses in the lower surface of the box member, thereby sufficiently fluidizing the whole of the upper layer of conductive balls, so that all of the suction holes can effectively and securely pick up and hold the conductive balls. The recesses direct the gas flow from the center portion of the lower portion of the box member to the periphery of the ball-placing head.

6 Claims, 6 Drawing Sheets

CONDUCTIVE BALL-PLACING APPARATUS

BACKGROUND OF THE INVENTION

1. Field of the Invention

This invention relates to a conductive ball-placing apparatus for placing electrically-conductive balls on electrodes of a workpiece, such as a chip and a board, so as to form bumps thereon.

2. Related Art

There is known a method of forming bumps (projected electrodes) on electrodes of a workpiece such as a chip and a board, in which a number of conductive balls are placed at the same time on the electrodes of the workpiece by a ball-placing head, and then these conductive balls on the electrodes are heated to be melted, for example, in a heating furnace, and then are allowed to solidify.

FIG. 5 is a perspective view showing a ball-placing head of a conventional conductive ball-placing apparatus upside down, and FIG. 6 is an enlarged, cross-sectional view of a portion of this apparatus, showing the process of picking up conductive balls by the ball-placing head. In FIG. 5, the ball-placing head 1 comprises a box member 2 having suction holes 3 formed through a bottom wall thereof. In this example, in order to place the conductive balls on four workpieces at a time, four groups of suction holes 3 each in a square pattern are arranged at the bottom surface of the box member 2. Reference numeral 4 denotes a flange formed at an upper peripheral edge of the box member 2.

In FIG. 6, the box member 2 is moved downward to rest on an upper surface of layers of conductive balls 6 stored in a large amount in a container 5, and the conductive balls 6 are held respectively by the suction holes 3 under suction (vacuum), and then the box member 2 is moved upward, thereby picking up the conductive balls 6 suction-held respectively by the suction holes 3. Gas, such as air, is blown or injected into a lower portion of the container 5, and the gas flows upward as indicated by broken-line arrows (FIG. 6), thereby fluidizing the conductive balls. By thus fluidizing the conductive balls 6, conductive balls 6 of a very small size can be easily suction-held by the suction holes 3. The box member 2 is connected to a suction device (or suction source).

In FIG. 6, the gas is blown or injected to flow upward through the whole of the interior of the container 5. However, when the lower surface of the box member 2 rests on the upper surface of the layers of conductive balls 6 so as to pick up the conductive balls 6 as shown in FIG. 6, the gas flows upward mainly to a space around the box member 2 as indicated by broken-line arrows (FIG. 6), while the gas is blocked or interrupted by the lower surface of the box member 2 at a central portion thereof, and can not sufficiently flow upward. Therefore, at a peripheral portion A in the container 5, the conductive balls 6 are sufficiently moved, and can be positively suction-held by the suction holes 3, but at a central portion B, the conductive balls 6 are not sufficiently fluidized, which results in a problem that those suction holes 3, disposed above this central portion B, often fail to pick up the conductive balls 6.

SUMMARY OF THE INVENTION

With the above problems in view, it is an object of this invention to provide a conductive ball-placing apparatus capable of effectively picking up conductive balls stored in a reservoir.

According to the present invention, there is provided a conductive ball-placing apparatus comprising:

a reservoir for storing electrically-conductive balls;

a ball-placing head for picking up the conductive balls, suction-held respectively by suction holes formed in a lower surface of the ball-placing head and for placing the thus suction-held conductive balls onto at least one workpiece positioned at a positioning portion; and means for feeding gas into the reservoir to fluidize the conductive balls in the reservoir, wherein gas-escaping recesses are formed respectively in those portions of the lower surface of the ball-placing head other than that area of the lower surface where the suction holes are formed.

In the present invention, in order to pick up the conductive balls stored in the reservoir, the ball-placing head moves downward to rest on the upper surface of the layers of conductive balls, and in this condition the gas, blown upward, flows upward into the recesses formed in the lower surface of the ball-placing head, so that the upper layer of conductive balls is sufficiently fluidized over an entire area of the lower surface of the ball-placing head, and therefore, all the suction holes can certainly hold the conductive balls by suction so as to pick up the conductive balls.

DESCRIPTION OF THE PREFERRED EMBODIMENT

Figure 1:
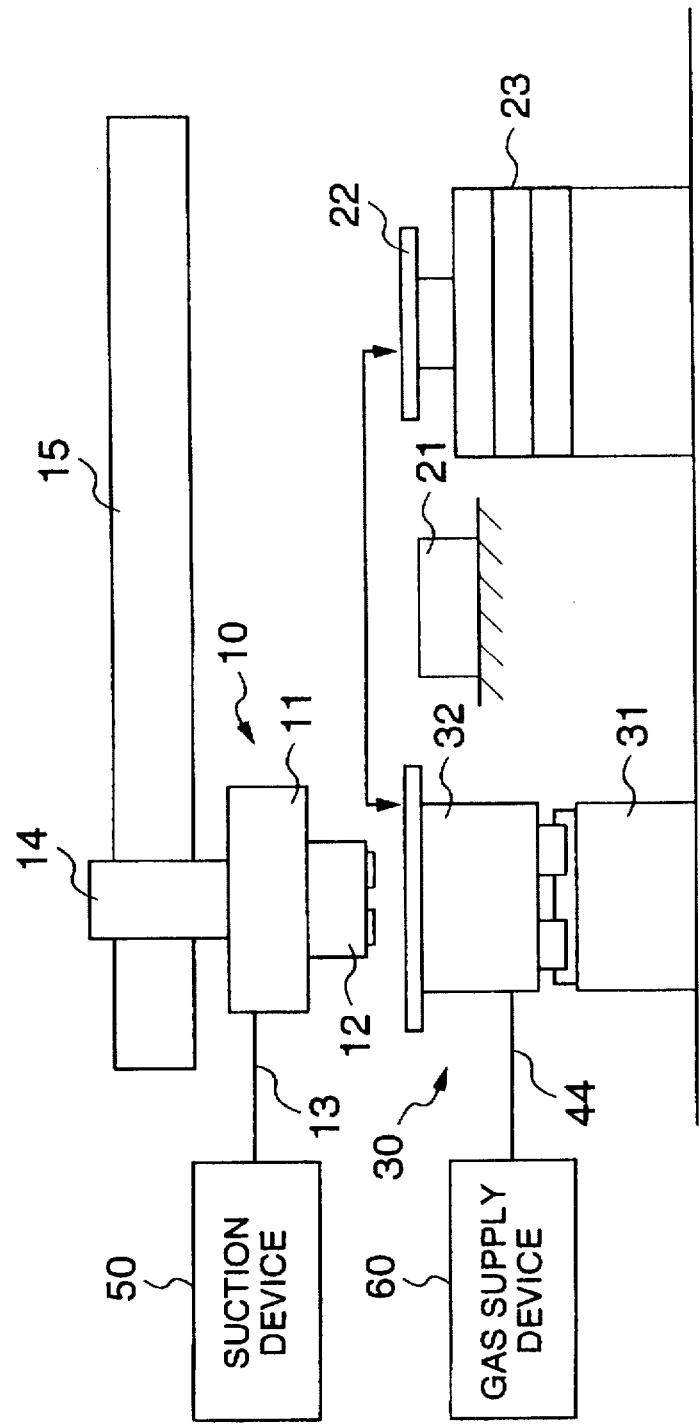
FIG. 1 is a side-elevational view of one preferred embodiment of a conductive ball-placing apparatus according to the present invention.
Figure 3:
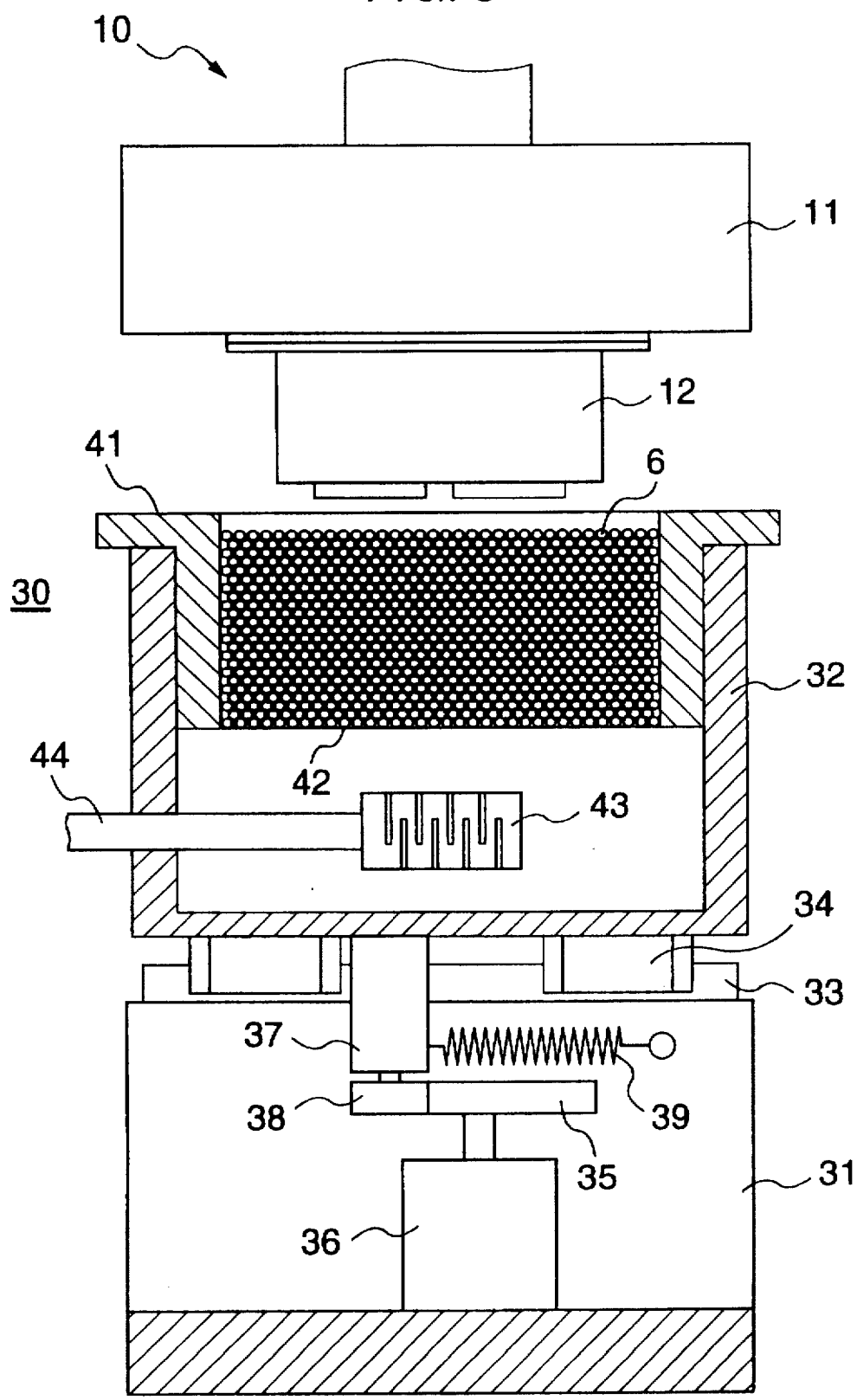
FIG. 3 is a cross-sectional view showing a reservoir of the apparatus for holding conductive balls therein.
Figure 4:
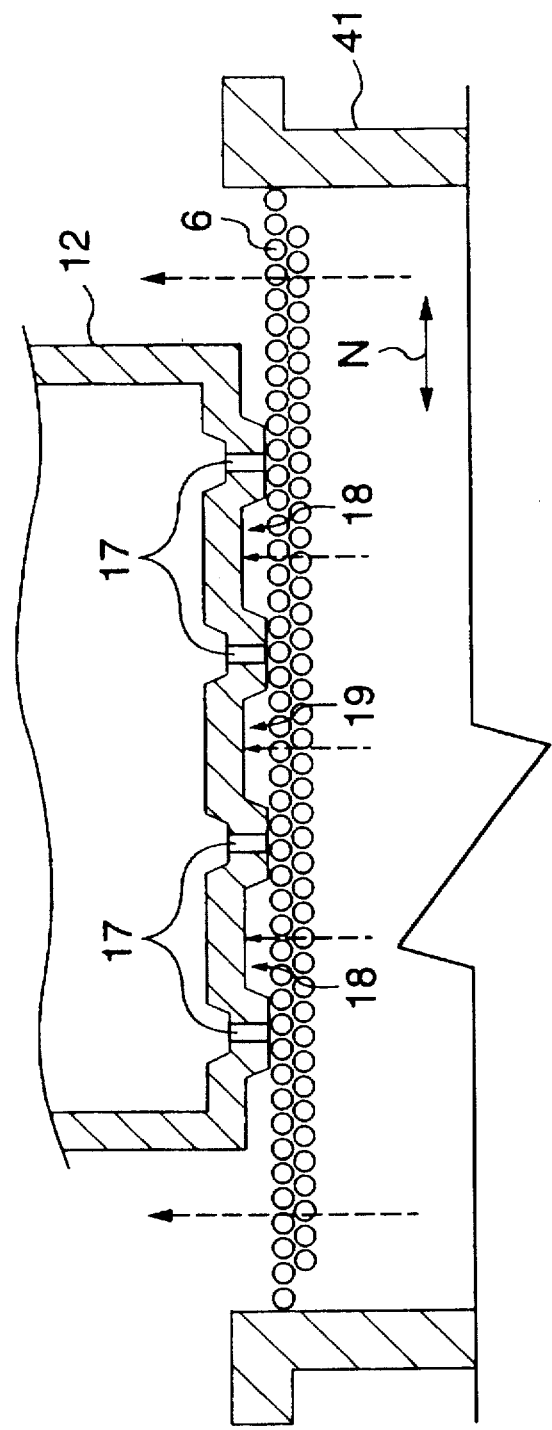
FIG. 4 is an enlarged, cross-sectional view of a portion of the apparatus, showing the process of picking up the conductive balls by the ball-placing head.
Figure 5:
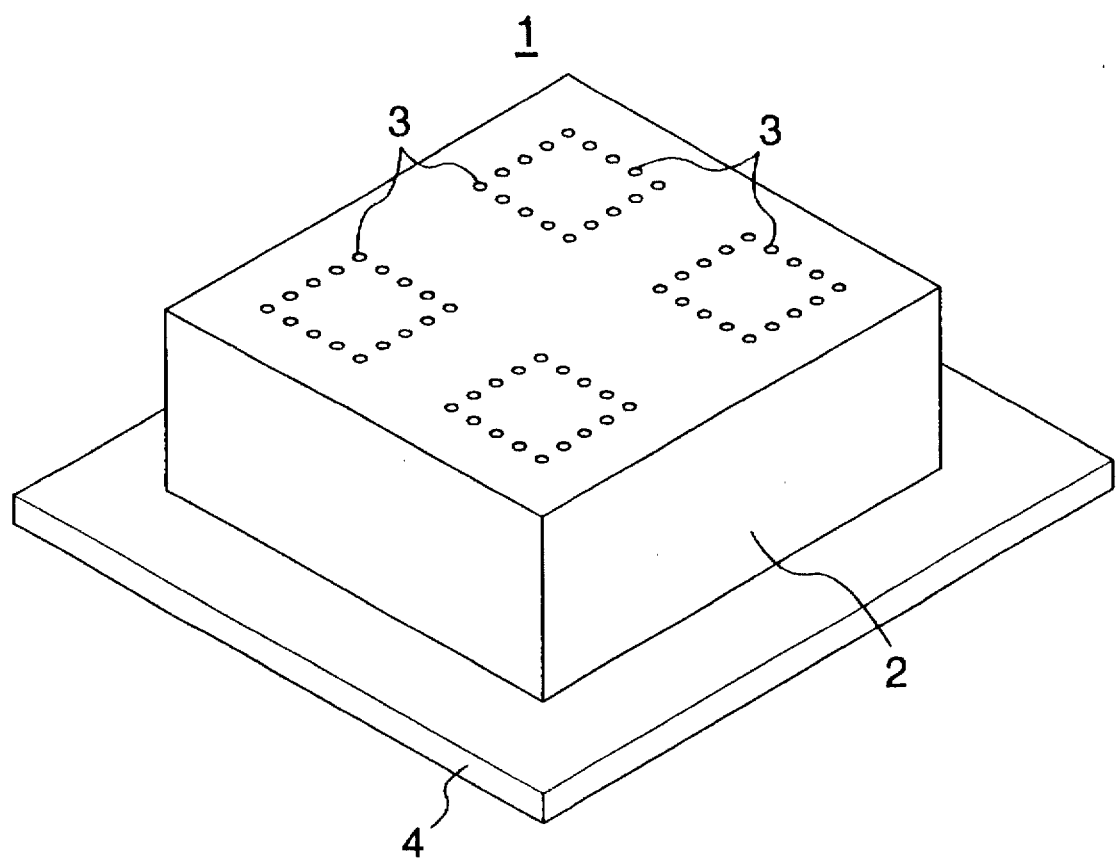
FIG. 5 is a perspective view showing a ball-placing head of a conventional conductive ball-placing apparatus upside down.
Figure 6:
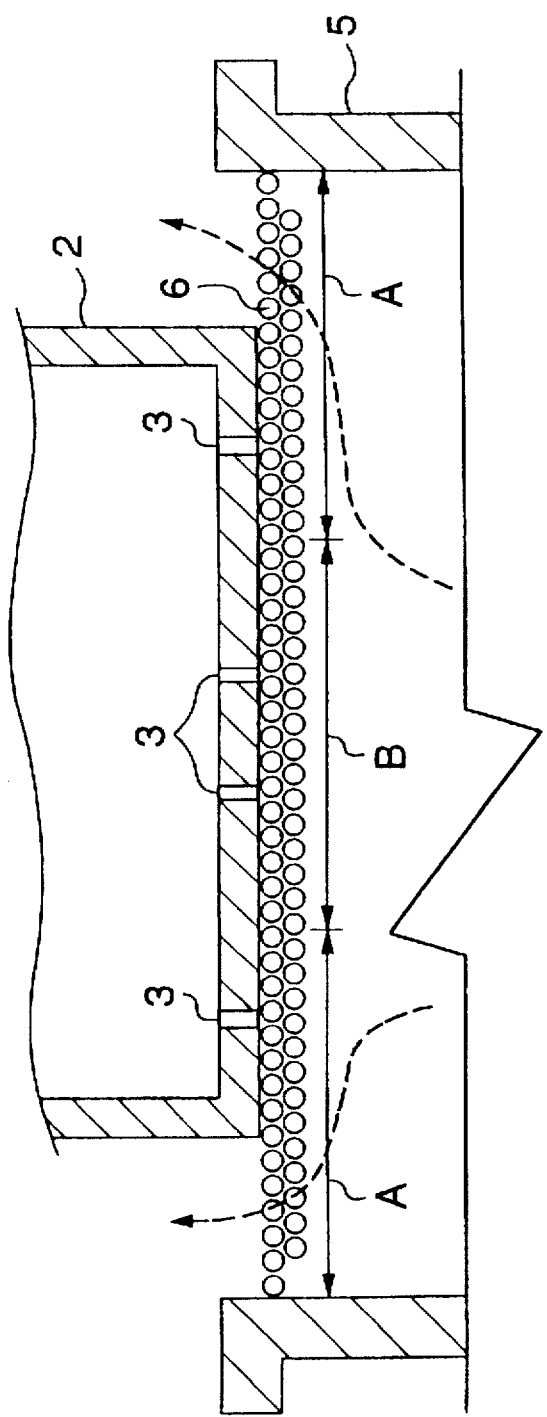
FIG. 6 is an enlarged, cross-sectional view of a portion of this conventional apparatus, showing the process of picking up conductive balls by the ball-placing head.

A preferred embodiment of the present invention will now be described with reference to the drawings. FIG. 1 is a side-elevational view of one preferred embodiment of a conductive ball-placing apparatus according to the invention, FIG. 2 is a perspective view showing a ball-placing head of this apparatus upside down, FIG. 3 is a cross-sectional view showing a reservoir for holding conductive balls therein, and FIG. 4 is an enlarged, cross-sectional view of a portion of this apparatus, showing the process of picking up the conductive balls by the ball-placing head.

In FIG. 1, the ball-placing head 10 comprises a body 11, and a box member 12 connected to the lower side of the body 11. The body 11 is connected to a suction device 50 through a tube 13. A block 14 is connected to the upper side of the body 11. A moving mechanism for moving the ball-placing head 10 upward and downward is mounted within the block 14. The block 14 is mounted on a movable table 15, and is movable laterally horizontally along the movable table 15.

Figure 2:
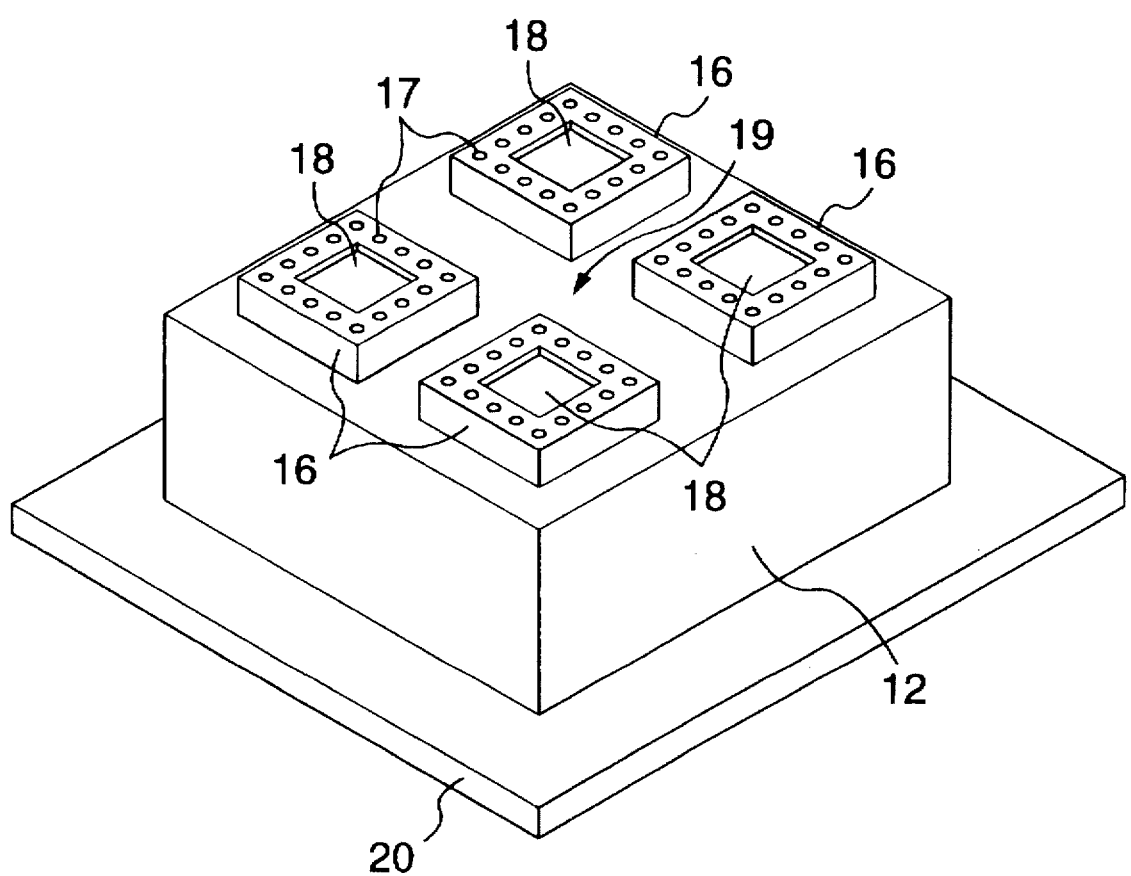
FIG. 2 is a perspective view showing a ball-placing head of the apparatus upside down.

In FIG. 2, four projections 16 each in the form of a square frame are formed on the lower surface of the box member 12, and suction holes 17 are formed in each projection 16, and are arranged in a square pattern. Therefore, in this apparatus, electrically-conductive balls are placed on four workpieces at the same time as in the above-mentioned conventional apparatus. A gas-escaping recess 18 is formed in a central portion of each of the projections 16, and also a gas-escaping recess 19 of a cross-shape is formed by the four projections 16 at the lower surface of the box member 12. A flange 20 is formed at an upper peripheral edge of the box member 12, and the box member 12 is secured to the body 11 through this flange 20.

In FIG. 1, the reservoir 30 for holding the electrically-conductive balls 6 therein, a flux vessel 21 and a workpiece placing portion 23 for supporting workpieces 22 thereon are provided beneath and along a path of travel of the ball-placing head 10. The construction of the conductive ball reservoir 30 will now be described with reference to FIG. 3. A box 32 is mounted on a base 31. A guide rail 33 is mounted on an upper surface of the base 31, and sliders 34 are mounted on a lower surface of the box 32, and are fitted in the guide rail 33. A motor 36 for rotating a cam 35 is mounted on a lower portion of the base 31. A rod 37 extends downwardly from the lower surface of the box 32, and a roller 38 in contact with the cam 35 is rotatably mounted on a lower end of the rod 37. The rod 37 is urged right (in FIG. 3) by a spring 39, and the roller 38 is resiliently held against an outer peripheral surface of the cam 35 by this spring force. With this construction, when the motor 36 is driven to rotate the cam 35, the box 32 is reciprocally vibrated or shaken laterally (horizontally) along the guide rail 33.

A container 41 is removably mounted on an upper portion of the box 32. The container 41 has a bottom defined by a vent plate 42 comprising, for example, a mesh plate. A large number of electrically-conductive balls 6 are stored on the vent plate 42. A gas injection nozzle 43 is provided beneath the container 41. The nozzle 43 is connected to a gas supply device 60 (FIG. 1) through a tube 44. Gas, injected from the nozzle 43, flows upward through layers of conductive balls 6 on the vent plate 42 to fluidize the conductive balls 6. The motor 36 is driven to vibrate the box 32 laterally, thereby further fluidizing the conductive balls 6.

The conductive ball-placing apparatus of this embodiment is constructed as described above, and an operation for placing the conductive balls 6 on the workpieces 22 will now be described. In FIG. 1, the ball-placing head 10 reaches a position above the reservoir 30, and moves downward and upward so as to pick up the conductive balls 6 stored in the container 41. FIG. 4 shows a condition in which the ball-placing head 10 is disposed in its lowered position, with the lower surface of the box member 12 resting on the upper surface of the layers of conductive balls 6 in the container 41, so as to pick up the conductive balls 6. In this condition, the gas is injected from the nozzle 43 to flow upward (see broken-line arrows), and also the motor 36 is driven to vibrate the container 41 laterally (as indicated by arrow N), thereby fluidizing the conductive balls 6. In this condition in which the box member 12 rests on the upper surface of the layers of conductive balls 6 in the container 41, the gas flows upward not only to a space around the box member 12 but also into the recesses 18 and 19, so that the whole of the upper layer of conductive balls 6 is sufficiently moved. Therefore, all the suction holes 17 can certainly hold the conductive balls 6 by suction, respectively.

Thereafter, the ball-placing head 10 moves upward to pick up the conductive balls 6 suction held by the respective suction holes 17 (see FIG. 1), and then moves toward the flux vessel 21. The ball-placing head 10 is once stopped at a position above the flux vessel 21, and then moves downward to apply a flux to lower surfaces of the conductive balls 6 suction-held by the respective suction holes 17, and then moves upward.

Then, the ball-placing head 10 moves to a position above the workpieces 22, and then moves downward, and the suction-held condition of the conductive balls 6 is released, thereby placing the conductive balls 6 on electrodes (not shown) on the upper surfaces of the workpieces 22, and then the ball-placing head 10 moves upward. The workpieces 22, having the conductive balls 6 placed thereon, are fed to a heating furnace (not shown), and are heated in this heating surface, so that the conductive balls 6 on the electrodes of the workpieces 22 are melted and then solidified to form bumps, respectively.

The present invention is not to be limited to the above embodiment, and for example the arrangement of the suction holes formed in the ball-placing head is determined according to a workpiece to be processed.

In the present invention, in order to pick up the conductive balls stored in the reservoir, the ball-placing head moves downward to rest on the upper surface of the layers of conductive balls, and in this condition the gas, blown upward, flows upward into the recesses formed in the lower surface of the ball-placing head, so that the whole of the upper layer of conductive balls is sufficiently fluidized, and therefore, all the suction holes can certainly hold the conductive balls by suction so as to pick up the conductive balls.

What is claimed is:

1. A conductive ball-placing apparatus comprising:

a reservoir for storing electrically-conductive balls;

a ball-placing head including a lower surface having a first portion having suction holes formed therein for picking up and holding the conductive balls by suction and for placing the thus suction-held conductive balls onto at least one workpiece positioned at a positioning portion; and means for feeding gas into said reservoir to fluidize the conductive balls in said reservoir;

said lower surface of said ball-placing head having a second portion having gas-escaping recesses formed therein, said gas-escaping recesses comprising means for causing said gas to flow from a center position of said lower surface to a periphery of said ball-placing head.

2. Apparatus according to claim 1, further comprising means for moving said reservoir reciprocally in a substantially horizontal direction.

3. A conductive ball-placing apparatus comprising:

a reservoir for storing electrically-conductive balls;

a ball-placing head including a lower surface having a first portion having suction holes formed therein for picking up and holding the conductive balls by suction and for placing the thus suction-held conductive balls onto at least one workpiece positioned at a positioning portion; and means for feeding gas into said reservoir to fluidize the conductive balls in said reservoir;

said first portion of the lower surface of said ball-placing head at which said suction holes are formed being projected relative to a second portion of said lower surface, and said gas being allowed to escape from said reservoir through said second portion of said lower surface other than said first portion of said lower surface at which said suction holes are formed, said projected portion comprising means for causing said gas to flow from a center portion of said lower surface to a periphery of said ball-placing head.

4. Apparatus according to claim 3, further comprising means for moving said reservoir reciprocally in a substantially horizontal direction.

5. A conductive ball-placing apparatus comprising:

a reservoir for storing electrically-conductive balls;

a ball-placing head including a lower surface having a first portion having suction holes formed therein for picking up and holding the conductive balls by suction and for placing the thus suction-held conductive balls onto at least one workpiece positioned at a positioning portion; and means for feeding gas into said reservoir to fluidize the conductive balls in said reservoir;

said lower surface of said ball-placing head having a second position having gas-escaping recesses formed therein, said suction holes penetrating all the way through said lower surface and said gas-escaping recesses extending only part of the way into said lower surface.

6. Apparatus according to claim 5, further comprising means for moving said reservoir reciprocally in a substantially horizontal direction.

* * * * *